(12) United States Patent
Kamei et al.

(10) Patent No.: US 7,154,838 B2
(45) Date of Patent: Dec. 26, 2006

(54) OPTICAL DETECTOR, OPTICAL HEAD DEVICE, OPTICAL INFORMATION PROCESSING DEVICE, AND OPTICAL INFORMATION PROCESSING METHOD

(75) Inventors: Tomotada Kamei, Neyagawa (JP); Shin-ichi Kadowaki, Sanda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 97 days.

(21) Appl. No.: 10/511,991

(22) PCT Filed: May 6, 2003

(86) PCT No.: PCT/JP03/05669

§ 371 (c)(1),
(2), (4) Date: Oct. 21, 2004

(87) PCT Pub. No.: WO03/098702

PCT Pub. Date: Nov. 27, 2003

(65) Prior Publication Data

US 2006/0164959 A1    Jul. 27, 2006

(30) Foreign Application Priority Data

May 15, 2002    (JP) .............................. 2002-139610

(51) Int. Cl.
*G11B 7/00*    (2006.01)
(52) U.S. Cl. ................................ 369/112.08; 369/44.14
(58) Field of Classification Search ........... 369/112.08; 350/214.1
See application file for complete search history.

(56) References Cited

U.S. PATENT DOCUMENTS

| | | | |
|---|---|---|---|
| 5,583,076 A | 12/1996 | Yoshizawa et al. | |
| 5,859,423 A * | 1/1999 | Shimoyama et al. | 250/214.1 |
| 6,144,107 A | 11/2000 | Narita | |
| 6,594,221 B1 * | 7/2003 | Ogasawara | 369/112.19 |

FOREIGN PATENT DOCUMENTS

| | | |
|---|---|---|
| JP | 49-114362 | 10/1974 |
| JP | 63-830 | 1/1988 |
| JP | 4-152556 | 5/1992 |
| JP | 4-196588 | 7/1992 |

* cited by examiner

*Primary Examiner*—Wayne Young
*Assistant Examiner*—Van T. Pham
(74) *Attorney, Agent, or Firm*—Hamre, Schumann, Mueller & Larson, P.C.

(57) ABSTRACT

A photodetector, includes: a semiconductor chip that converts received light to an electric signal; and a resin body that encapsulates the semiconductor chip. The photodetector further includes a protective unit, and at least a light transmission area, through which the light passes, in a surface of the resin body on an incident side of the light is covered by the protective unit. Covering the light transmission area with the protective unit that is less in reactivity with light than the resin body can suppress deformation of the resin body due to light, thus suppressing deterioration of the optical characteristics of the photodetector.

9 Claims, 4 Drawing Sheets

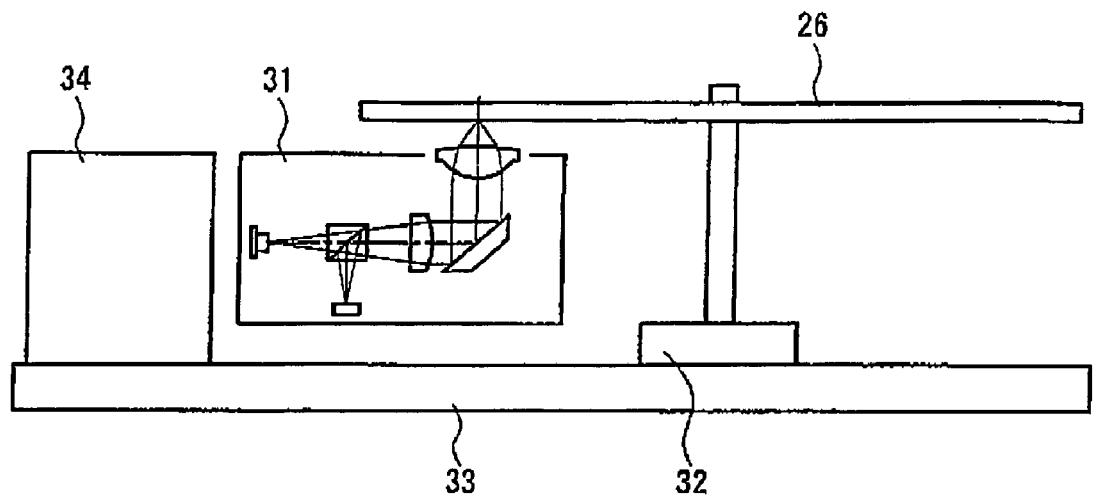
FIG. 6
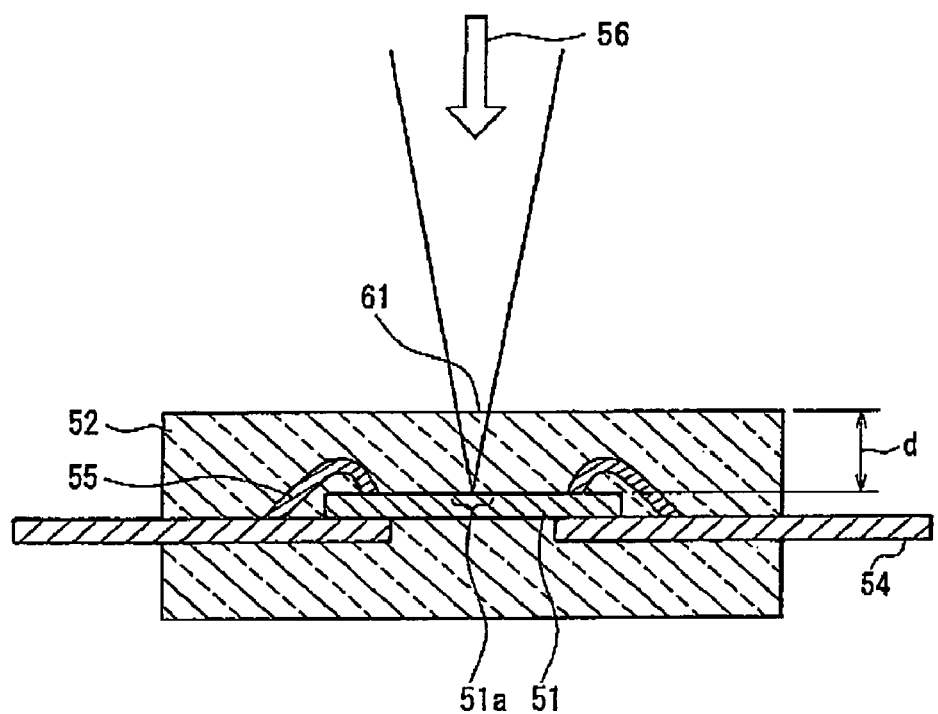
FIG. 7 -- Prior Art --

US 7,154,838 B2

OPTICAL DETECTOR, OPTICAL HEAD DEVICE, OPTICAL INFORMATION PROCESSING DEVICE, AND OPTICAL INFORMATION PROCESSING METHOD

TECHNICAL FIELD

The present invention relates to a photodetector and an optical head device, an optical information processing device and an optical information processing method using the photodetector.

BACKGROUND ART

Optical memory technology utilizing high-density and large-capacity optical storage media having a pit-formed pattern has been applied to a digital audio disc, a video disc, a document file disc and further a data file, etc. During the 1980s, compact discs (CD) that record and reproduce information by irradiation with light having a wavelength of about 780 nm became commercially practical, and during the 1990s, digital versatile discs (DVD) became commercially practical, which can record and reproduce higher density and larger amounts of information than the CDs by irradiation with light having a wavelength of about 650 nm. Both of these are used commonly today.

In the above optical memory technology, information is recorded and reproduced with respect to an optical storage medium by a minutely collected light beam. The accuracy and reliability of these recording and reproduction operations depend critically on the accuracy and reliability of an optical head device. Essential functions of the optical head device are roughly classified into: a function of converging light output from a light source to a minute spot diameter on the order of the diffraction limit; and a function of detecting a signal required for focus control so as to maintain a light spot on the optical storage medium, a signal required for tracking control so as to position the light spot at a midpoint of a specific track and a pit signal.

Meanwhile, one element constituting the optical head device is a photodetector. The photodetector receives light reflected from the optical storage medium, converts it into an electric signal (photoelectric conversion), detects an information signal recorded on the optical storage medium (hereinafter referred to as "RF signal"), a focus error signal (hereinafter referred to as "FE signal"), a tracking error signal (hereinafter referred to as "TE signal") and the like, which are signals required for recording and reproducing, and outputs these signals. The photodetector also is used for receiving a part of the light emitted from the light source so as to control an output from the light source.

The above-described photodetector generally conducts the photoelectric conversion using a semiconductor with a photoelectric conversion area and, if required, a circuit attached thereto built therein. In order to carry out reliable recording and reproducing, needless to say, the photodetector also is required to have high reliability.

FIG. 7 shows one example of a conventional photodetector. A semiconductor chip 51 is secured onto a lead frame 54, and an electrode on the semiconductor chip 51 and a lead of the lead frame 54 are connected electrically via a bonding wire 55. The lead frame 54 is a terminal for inputting/outputting electric signals and electric power, and the photodetector is connected electrically with a flexible printed wiring board (not illustrated) and the like via the lead frame 54. The semiconductor chip 51, the bonding wire 55 and a part of the lead frame 54 are encapsulated within a resin body 52 having a light-transmitting property. The resin body 52 protects the bonding wire 55, a junction between the semiconductor chip 51 and the bonding wire 55, a surface of the semiconductor chip 51 with a circuit and the like built therein, and so on in order for these portions not to break due to a shock during the handling.

Light 56 reflected from the optical storage medium and containing a signal component having information recorded on the optical storage medium and the like passes through the resin body 52 and reaches a photoelectric conversion area 51a on the semiconductor chip 51 to undergo the photoelectric conversion. The photoelectrically converted signal travels through the bonding wire 55 to be output from the lead frame 54 as an electric signal. To this end, a material having a necessary transparency with respect to the light 56 and a favorable moldability, e.g., an epoxy resin is used as the resin body 52 (See JP S63(1988)-830 A, pp 1 to 2, FIG. 6, for example).

In recent years, an optical storage medium that allows recording and reproducing of still higher-density and larger-capacity information than that in DVDs has been developed, with the intention of shortening a wavelength of a light source used for the recording and reproducing of information with respect to such an optical storage medium from a red light source (wavelength of about 660 nm) to a blue light source (wavelength of about 400 nm). However, when a wavelength of light used for the recording and reproducing with respect to an optical storage medium is changed to, for example, about 400 nm, a light transmission area 61 of the light-transmissive resin 52 in the photodetector shown in FIG. 7 will be deformed gradually over a few hours to a few hundred hours due to the light incident on the photodetector. This adversely affects an optical path of the light passing through the light transmission area 61, thus making it impossible for the light reflected from the optical storage medium to reach the photoelectric conversion area 51a on the semiconductor chip 51 while maintaining a correct profile. As a result, the photodetector cannot detect desired electric signals such as a FE signal and a TE signal sufficiently. Therefore, an optical information processing device using an optical head device including such a photodetector has a problem of the failure in adequate operations by a focus control unit and a track control unit.

In addition, there is another problem of a decrease in the amplitude of a RF signal, which impairs the reliability of reproducing.

Also in a photodetector that has a function of detecting a signal used for judging the magnitude of a light amount to control an output from a light source and outputting the signal, if the resin body 52 is deformed significantly, a part of the light does not reach the photoelectric conversion area 51a due to reflection, diffraction and the like. This leads to a problem of the failure in the precise detection of the above-stated signals.

DISCLOSURE OF THE INVENTION

A photodetector of the present invention includes: a semiconductor chip that converts received light to an electric signal; and a resin body that encapsulates the semiconductor chip. The photodetector further includes a protective unit, and at least a light transmission area, through which the light passes, in a surface of the resin body on an incident side of the light is covered by the protective unit.

An optical head device of the present invention includes: a light source; a condensing unit that receives light emitted from the light source and collects the light onto an optical storage medium; and a photodetector that receives light reflected from the optical storage medium and converts the light to an electric signal. The photodetector includes: a semiconductor chip that converts received light to an electric signal; and a resin body that encapsulates the semiconductor chip. The photodetector further includes a protective unit, and at least a light transmission area, through which the light passes, in a surface of the resin body on an incident side of the light is covered by the protective unit.

An optical information processing device of the present invention includes: an optical head device that includes a light source, a condensing unit that receives light emitted from the light source and collects the light onto an optical storage medium, and a photodetector that receives light reflected from the optical storage medium and converts the light to an electric signal; an electric signal processing unit that receives a signal output from the optical head device and outputs a predetermined signal; and a driving unit that receives the predetermined signal so as to change a position of at least one selected from the optical head device and the condensing unit. The photodetector includes: a semiconductor chip that converts received light to an electric signal; and a resin body that encapsulates the semiconductor chip. The photodetector further includes a protective unit, and at least a light transmission area, through which the light passes, in a surface of the resin body on an incident side of the light is covered by the protective unit.

An optical information processing method of the present invention is embodied using an optical information processing device that includes: an optical head device that includes a light source, a condensing unit that receives light emitted from the light source and collects the light onto an optical storage medium, and a photodetector that receives light reflected from the optical storage medium and converts the light to an electric signal; an electric signal processing unit that receives a signal output from the optical head device and outputs a predetermined signal; and a driving unit that receives the predetermined signal so as to change a position of at least one selected from the optical head device and the condensing unit. The photodetector includes: a semiconductor chip that converts received light to an electric signal; and a resin body that encapsulates the semiconductor chip, and the photodetector further includes a protective unit, and at least a light transmission area, through which the light passes, in a surface of the resin body on an incident side of the light is covered by the protective unit. In the case where a transmittance of light having a wavelength of $\lambda 1$ with respect to the resin body is 10%, a wavelength $\lambda$ of the light source satisfies a relationship of $\lambda 1 < \lambda < 1.5 \cdot \lambda 1$.

BRIEF DESCRIPTION OF DRAWINGS

FIG. 6 schematically shows one embodiment of an optical information processing device of the present invention.

FIG. 7 is a cross-sectional view showing one example of a conventional photodetector.

BEST MODE FOR CARRYING OUT THE INVENTION

The following describes embodiments of the present invention further in detail. Firstly, details for arriving at the present embodiments will be explained below.

Figure 1:
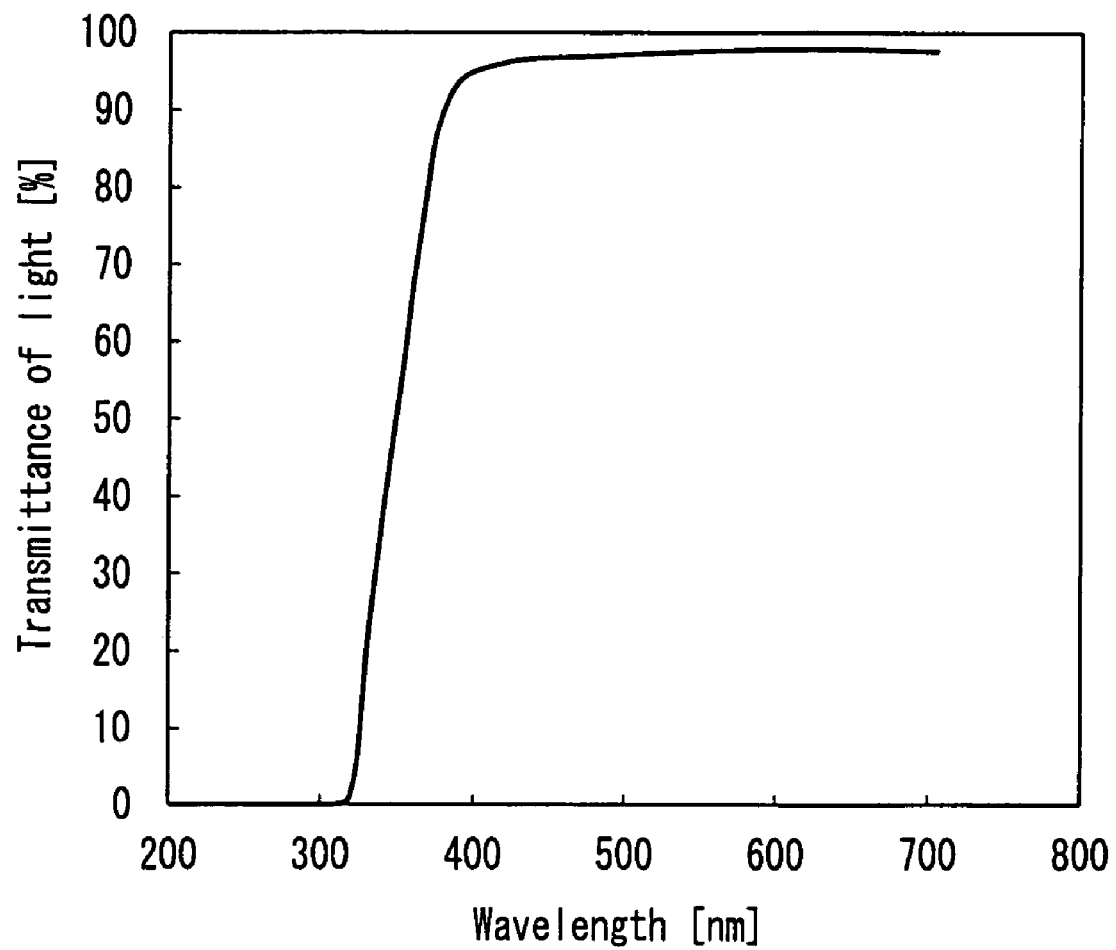
FIG. 1 shows a relationship between a wavelength of light incident on a photodetector and a transmittance of the light.

FIG. 1 shows a relationship between a wavelength of light incident on the photodetector shown in FIG. 7 and a transmittance of the light. In the photodetector shown in FIG. 7, the resin body 52 is made of an epoxy resin and has a thickness d of 1 mm.

As shown in FIG. 1, the transmittance of the light is almost constant in a region of the wavelength of the light longer than 450 nm and decreases gradually with a decrease in wavelength in a region shorter than 450 nm so as to be about 0 at the wavelength of about 320 nm. Although most of the light absorbed by the resin body 52 is turned to heat so as to be radiated, part of the absorbed light becomes an energy source for cutting covalent bonds of the resin making up the resin body 52.

When energy required for cutting the covalent bonds is converted using the relational formula of $E = h \cdot c / \lambda$ (E: energy, h: Planck constant, $\lambda$: wavelength, c: speed of light) so as to be represented by a wavelength possessed by a photon, a wavelength of light required for cutting a single bond ranges from 300 to 400 nm, and a wavelength of light required for cutting a double bond ranges from 150 to 200 nm. Therefore, when the resin body 52 is irradiated with light having a wavelength longer than 400 nm, the energy for disconnecting the double bond cannot be achieved at all and the energy for disconnecting the single bond is hardly achieved, and therefore it has been considered that the resin body 52 will not be deformed.

However, in the case where a temperature for using the photodetector reaches 270 K to 350 K, there is a probability, albeit a low probability, that a covalent bond is cut by the light with a wavelength longer than 400 nm also.

In addition, since a diameter of the light collected to be incident on the photoelectric conversion area 51a is as small as about 10 μm, which means that a light density per unit area is significantly high in the photoelectric conversion area 51a, the resin body 52 might generate multiphoton absorption in which two or more photons are absorbed concurrently. For example, when the resin body 52 generates two-photon absorption, then the resin 52 with transparency absorbs energy twice that of the reaction with one photon, and a covalent bond might be cut by such energy.

The resin making up the resin body 52 contains atoms such as carbon, hydrogen and oxygen, where these atoms are bonded with one another covalently. When these covalent bonds are cut by irradiation of the resin body 52 with light, these atoms become active. Normally, if the irradiation with light is ceased, the activated atoms return to the original bonding state. However, it has been found that when the light transmission area 61 is irradiated with light in an atmosphere of oxygen being present, a covalent bond of an oxygen molecule that exists in the vicinity of the light transmission area 61 also is cut. Since the oxygen atoms also become active, the atom whose covalent bonding has been cut bonds with the oxygen atom, thus deforming the resin body 52 gradually.

Thus, the inventors of the present invention arrived at an idea of covering at least a light transmission area through which light passes in a surface of a resin body 2 on a light incident side with a light-transmissive protective unit in order for this area not to contact with oxygen.

Embodiment 1

Figure 2:
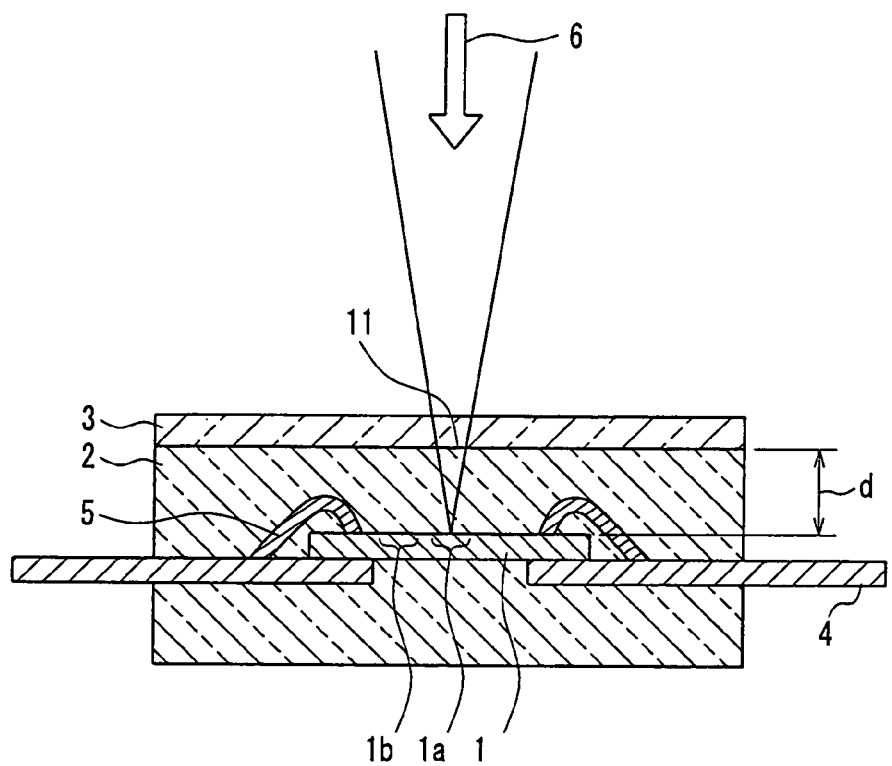
FIG. 2 is a cross-sectional view showing one embodiment of a photodetector of the present invention.

FIG. 2 is a cross-sectional view showing one embodiment of a photodetector of the present invention. The photodetector of this embodiment, as shown in FIG. 2, includes a semiconductor chip 1, a lead frame 4, a bonding wire 5, a resin body 2 having a light-transmitting property and a protective layer 3 having a light-transmitting property. The semiconductor chip 1 is mounted on the lead frame 4, and the semiconductor chip 1 and the lead frame 4 are connected electrically via a bonding wire 5. The semiconductor chip 1, the bonding wire 5 and a part of the lead frame 4 are encapsulated with the resin body 2. On a surface of the resin body 2 on an incident side of a converged light 6, the protective layer 3 is laminated so that at least a light transmission area 11 through which the converged light 6 passes does not contact with oxygen in the air.

According to the photodetector of this embodiment, since the surface of the resin body 2 on the incident side of the converged light 6 is covered with the protective layer 3 at least at the light transmission area 11 through which the converged light 6 passes, the following advantages can be obtained, for example: even when the resin body 2 is irradiated with high-density light in order to detect a FE signal accurately or to detect a noise ratio to a RF signal accurately, which would activate atoms contained in the resin body 2 in the light transmission area 11, the bonding of the thus activated atoms with an oxygen atom can be suppressed, thus allowing the deformation of the resin body 2 and the deterioration of optical characteristics of the photodetector to be suppressed. According to the photodetector of this embodiment that thusly enables the suppression of the deterioration of the optical characteristics, signals such as a FE signal, a TE signal and a RF signal can be detected and output accurately.

The semiconductor chip 1 includes a photoelectric conversion area 1a and a circuit 1b that are built therein, where the photoelectric conversion area 1a converts received light to a current signal and the circuit 1b amplifies the current signal output from the photoelectric conversion area 1a and converts the same to a voltage signal.

The lead frame 4 contains a conductive material, for example, metals such as Cu and an alloy (Fe—Ni), and in a state where the lead frame 4 is secured to a wiring board such as a flexible printed wiring board by a method of soldering and the like, the lead frame 4 functions as a terminal for inputting and outputting an electric signal such as the current signal or the voltage signal and electric power.

The bonding wire 5 is a thin metal wiring, e.g., a thin gold wiring, which delivers the current signal or the voltage signal obtained from the semiconductor chip 1 to the lead frame or supplies the semiconductor chip 1 with electric power.

A material of the protective layer 3 is not limited especially as long as the material does not react so much with light and oxygen and has a light transmittance of a predetermined value or higher. However, an inorganic substance having bond dissociation energy larger than that of an organic substance such as an epoxy resin is preferable. In particular, the material preferably includes at least one type of inorganic compound selected from the group consisting of silicon oxide, silicon nitride, magnesium fluoride and tantalum oxide. This is because these inorganic compounds can double as an insulation film of the semiconductor chip and an antireflection film of an optical component, which can reduce the number of the types of materials to be used and the number of manufacturing apparatuses, thus reducing a cost.

The protective layer preferably has a transmittance of light, which is substantially incident thereon except for a light amount reflected from the surface, of 90% or more and more preferably 95% or more. This is because a higher transmittance of light leads to a lower absorptance of the light, which suppresses a deterioration due to the light. It can be considered that when the transmittance is 90% or more, there is little deterioration of the protective layer due to light and when the transmittance is 95% or more, there occurs no deterioration substantially.

Unlike the resin body 2, there is no need to give the protective layer 3 a function for encapsulation, and therefore there is no need to form the protective layer 3 by a transfer molding method in which a molten resin is poured. Although a method for forming the protective layer 3 is not limited especially, it preferably is formed by, for example, sputtering, evaporation or spin coating, which facilitates the formation of the protective layer 3.

Although a thickness of the protective layer 3 is determined appropriately depending on the working conditions of the photodetector, a preferable thickness is 20 nm or more when the photodetector is used in a general optical head device where a wavelength of a light source is within a range of 390 nm to 420 nm and a power of the converged light 6 ranges from a few hundreds μW to a few mW. This is because, when the thickness is too small, there is a possibility of oxygen in the air and water vapor passing therethrough. Since water vapor contains oxygen atoms, when the water vapor passes through the protective layer 3, there is a possibility of the resin body 2 being deformed similar to the case where the resin body 2 is irradiated with light and an atmosphere of oxygen is present. In the case of the photodetector with the protective layer 3 of 20 nm or more in thickness, the deformation of the resin body 2 is not found even after the use over a few thousand hours, and signals such as a FE signal, a TE signal and a RF signal can be detected and output accurately.

Furthermore, it is preferable that the protective layer 3 is provided so as to function as an antireflection film. This is because, when the protective layer 3 has an antireflection function, a loss of light due to reflection can be reduced, and therefore an optical gain efficiency of the photodetector can be enhanced. The material and the thickness of the protective layer 3 may be determined based on a method for designing the antireflection film. Note here that a method for designing the antireflection film is generally well-known, so that explanations for that will be omitted.

A material of the resin body 2 is not limited especially as long as the material has a desired transmittance with respect to the light incident thereon. In addition, since the photodetector of this embodiment is equipped with the protective layer 3, the material of the resin body 2 can be selected while giving a priority to a favorable moldability rather than a resistance to deterioration due to the reaction with light. For instance, an epoxy resin, polycarbonate, polyolefin and the like can be used, and in particular it preferably contains an epoxy resin, which applies little load to the bonding wire 5 during the molding, is easily molded and has a favorable moldability under a low pressure.

Preferably, an absorptance of the light by the resin body 2 is 10% or less (transmittance of 90% or more). This is because, when the absorptance of the light by the resin body 2 is 10% or less, a photodetector can be provided with a still reduced tendency for the deformation of the light transmission area 11 due to the received light.

After the semiconductor chip 1 is mounted on the lead frame 4 and the semiconductor chip 1 and the lead frame 4 are connected electrically via the bonding wire 5, the resin body 2 is formed by a transfer molding method and the like so that a surface of the resin body 2 on a light incident side becomes parallel with a surface of the semiconductor chip 1. A thickness d between the light incident side surface of the resin body 2 and the surface of the semiconductor chip 1 with the photoelectric conversion area 1*a* formed thereon is set at 1 mm, for example.

According to the explanations with reference to FIG. 2, the light incident on the photodetector is light that is reflected from the optical storage medium and is converged. However, the light may be a part of the light emitted from the light source and the photodetector may be provided for detecting a signal used for controlling an output from the light source.

Furthermore, although the circuit 1*b* is provided on the semiconductor chip 1 in the illustrated example of FIG. 2, this is not limited to that example. As shown in FIG. 2, when the circuit 1*b* is provided on the semiconductor chip 1, heat is generated in the semiconductor chip 1 by a current flowing through the circuit 1*b*. As a temperature of the resin body 2, i.e., a temperature of the semiconductor chip, becomes higher, the degree of the deformation of the resin body 2 becomes more remarkable. When the circuit 1*b* is formed at a position away from the photoelectric conversion area 1*a* in the semiconductor chip or is provided at another portion of the photodetector that is not encapsulated with the resin body 2, the transmission of the heat generated in the circuit 1*b* to the light transmission area 11 can be suppressed, thus suppressing the deformation of the resin body 2, and enabling more stable detection and output of signals such as a FE signal, a TE signal and a RF signal.

Note here that although the semiconductor chip 1 and the lead frame 4 are connected electrically using the bonding wire 5 in the illustrated example of FIG. 1, a method for connecting the semiconductor chip 1 and the lead frame 4 is not limited especially. They may be connected by wireless bonding such as a flip-chip method. In the case where wireless bonding is adopted for the connection method, an injection molding method and other types of methods, which are conducted at higher temperatures and under higher pressures than in the transfer molding method, can be applied, thus enhancing the flexibility in a manufacturing method.

Furthermore, although the protective layer 2 is a single layer in the illustrated example of FIG. 2, this is not limited to that example. The protective layer 3 may have a multi-layered structure in which two or more layers made of different materials are laminated.

Embodiment 2

Figure 3:
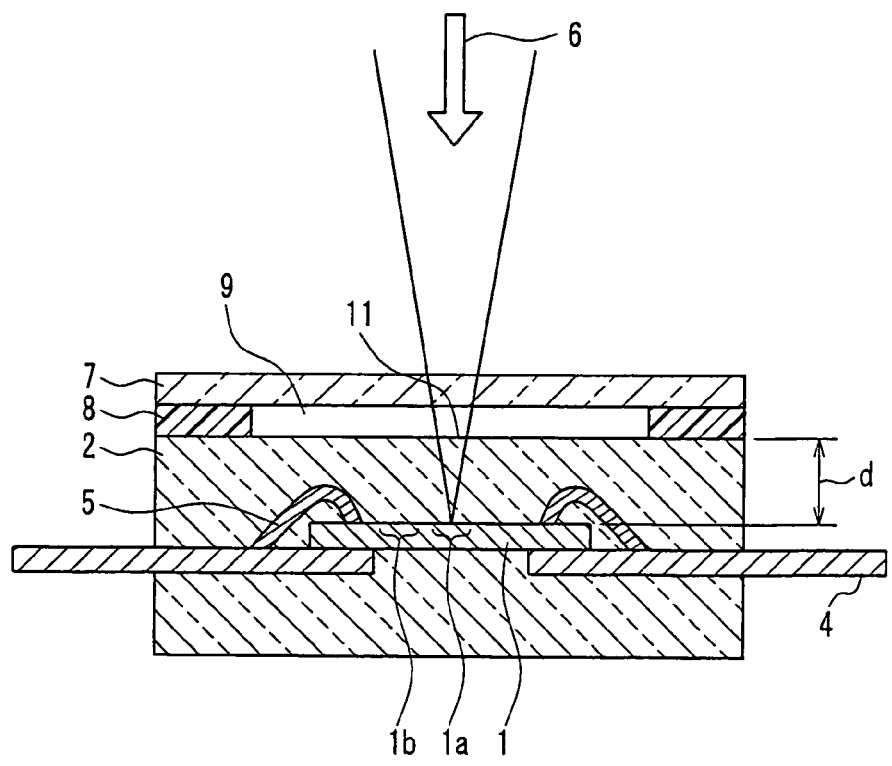
FIG. 3 is a cross-sectional view showing another embodiment of a photodetector of the present invention.

FIG. 3 is a cross-sectional view showing one embodiment of the photodetector of the present invention. In FIG. 3, the same reference numerals are assigned to the elements having the same functions as those of the elements shown in FIG. 2 and their explanations will be omitted.

In the photodetector of this embodiment, instead of the protective layer 3 (See FIG. 2), a light transmission area 11 is covered with a flat plate member 7, a sealing member 8 and inert gas in order for the area not to contact with oxygen in the air. The plate member 7 has a light-transmitting property and is disposed at least above the light transmission area 11. The sealing member 8 bonds the plate member 7 with a resin body 2 and is located so as to be away from the light transmission area 11, and the inert gas is enclosed in a space 9 surrounded by a surface of the resin body 2 on an incident side of light 6, the plate member 7 and the sealing member 8.

In the photodetector of this embodiment, at least the light transmission area 11 in the surface of the resin body 2 on the incident side of the light 6 is covered with a protective unit including the plate member 7, the sealing member 8 and the inert gas enclosed in the space 9. Therefore, similarly to Embodiment 1, for example, even when the resin body 2 is irradiated with the high-density converged light 6, which would activate atoms contained in the resin body 2 at the light transmission area 11, the bonding of the thus activated atoms with an oxygen atom can be suppressed, thus enabling the suppression of the deformation of the resin body 2. As a result, according to the photodetector of this embodiment, signals such as a FE signal, a TE signal and a RF signal can be detected and output accurately.

A material of the plate member 7 is not limited especially as long as the reaction with oxygen is sufficiently less than the resin body 2 or there occurs no reaction with oxygen when being irradiated with light having a predetermined wavelength, and it has a desired transmittance with respect to the light incident thereon. For example, silica glass and borosilicate glass are preferable.

The plate member 7 preferably has a transmittance of light, which is substantially incident thereon except for a light amount reflected from the surface, of 90% or more and more preferably 95% or more. This is because a higher transmittance of light leads to a lower absorptance of the light, which suppresses a deterioration due to the light. It can be considered that when the transmittance is 90% or more, there is a little deterioration of the plate member 7 due to light and when the transmittance is 95% or more, substantially no deterioration occurs.

Although the type of the inert gas enclosed in the space 9 is not limited especially as long as it does not react with the resin body 2 when being irradiated with light and does not hinder the transmission of the light, and it preferably includes nitrogen, which is available at a low cost. For example, in the case where a wavelength of the light incident on the photodetector is within a range of 390 nm<λ<420 nm, the inert gas enclosed in the space 9 may be argon. Furthermore, gas other than inert gas may be enclosed in the space 9, and oxygen may be included if it is included at about 1/10 (about 2.5%) or less of the oxygen concentration in the air.

These gases can be enclosed in the space 9 easily by assembling the photodetector of this embodiment in an atmosphere of these gases.

The sealing member 8 preferably is one having a small amount of outgassing therefrom (1% or less), such as an ultraviolet-curing adhesive, a silicone-based adhesive and an epoxy-based adhesive. This is because the outgas generated from the sealing member 8 and mixed into the inert gas in the space 9 is combined with atoms on the surface of the resin body 2 when the outgas is activated by irradiation with light. Although the degree of the combination depends on the intensity of the irradiated light, if the combined outgas forms a lens on the surface of the resin body 2, a deviation of a condensing position on the resin body 2 occurs. This results in the failure of the light to be received by the semiconductor chip 1 successfully.

As shown in FIG. 3, in the embodiment where the sealing member 8 is located away from the light transmission area 11, there are no limitations on the light-transmitting property of the sealing member 8 at all. However, in the case where the sealing member 8 has a desired transmittance with respect to the incident light, i.e., is substantially transparent with respect to the incident light, the space 9 may be filled with the sealing member 8. That is to say, the protective unit that covers the light transmission area 11 to prevent the light transmission area 11 from contacting with oxygen may be configured with a plate member 7 and a sealing member 10, as shown in FIG. 4, where the plate member 7 is disposed above a surface of the resin body 2 on an incident side of light, and the sealing member 10 bonds at least the light transmission area 11 of the surface of the resin body 2 on the light incident side with the plate member 7 and has a light-transmitting property.

Figure 4:
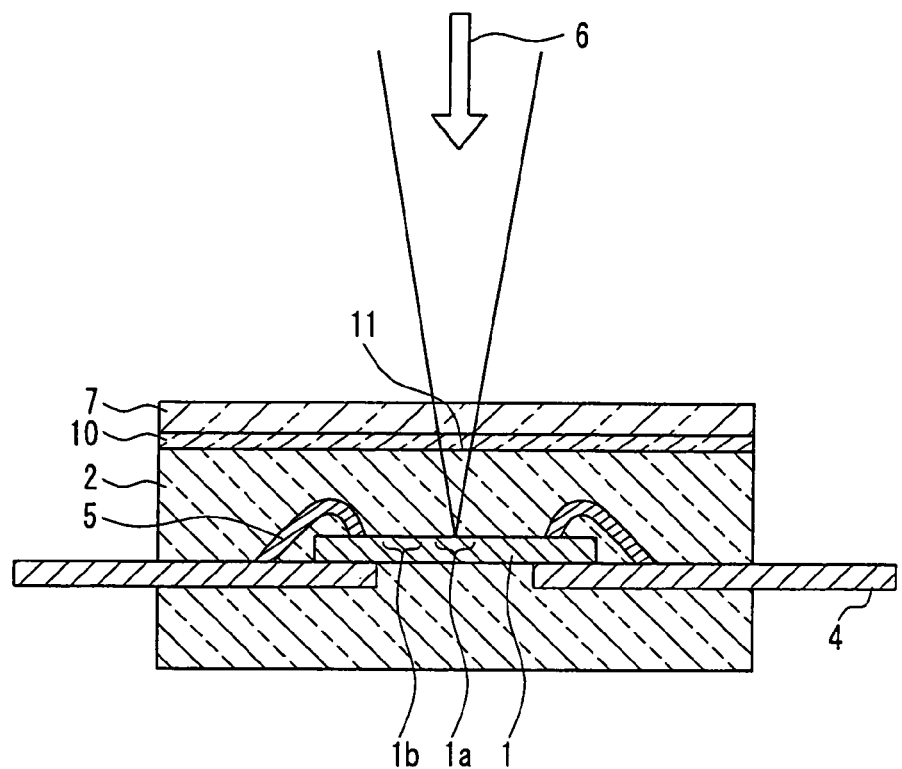
FIG. 4 is a cross-sectional view showing still another embodiment of a photodetector of the present invention.

Note here that although the incident light side surface of the light-transmissive plate member 7 of the photodetector is planar in the embodiments shown in FIG. 3 and FIG. 4, it may be a lens-form or a hologram-form so that the light 6 can have a desired wavefront such as astigmatism or may have an optical function such as splitting a part of the light 6, whereby a small optical head device can be realized.

Embodiment 3

Figure 5:
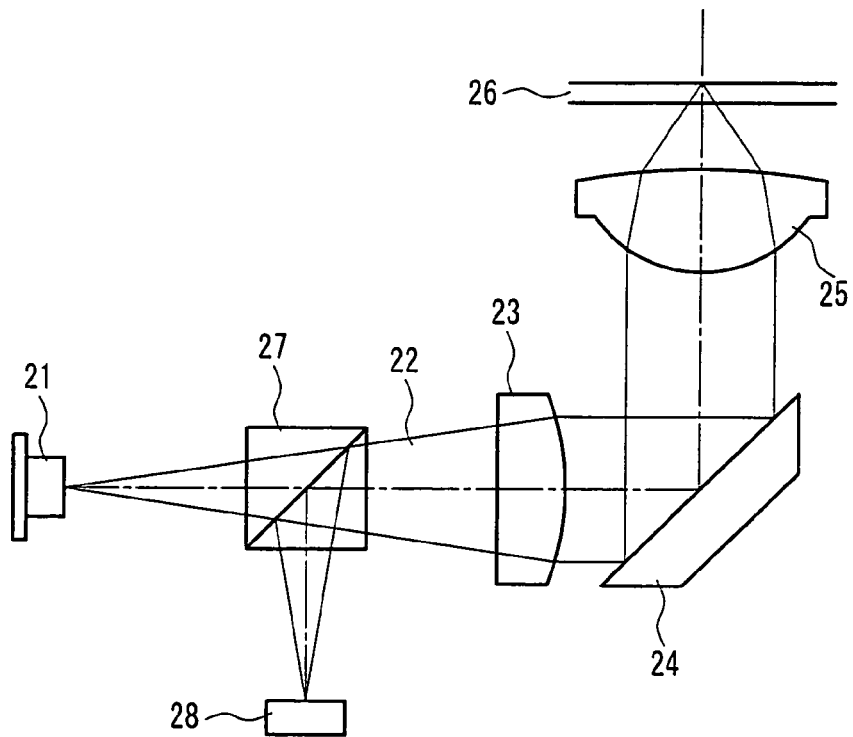
FIG. 5 shows a configuration of one embodiment of an optical head device of the present invention.

FIG. 5 shows one embodiment of the optical head device of the present invention. As shown in FIG. 5, the optical head device includes a semiconductor laser 21, as a light source, capable of emitting laser light with a wavelength in the range of 390 nm<$\lambda$<420 nm, a condensing lens 23, a mirror 24 for bending an optical path, an objective lens 25, a beam splitter 27 for separating returning light reflected from an optical storage medium 26 and a photodetector 28. As the photodetector 28, the photodetector of Embodiment 1 or Embodiment 2 is used.

When information recorded on the optical storage medium 26 is reproduced, laser light 22 emitted from the semiconductor laser 21 having a wavelength of 405 nm, for example, becomes parallel light by the condensing lens 23, and an optical path thereof is bent by the mirror 24. Then, the light is collected onto the optical storage medium 26 by the objective lens 25. Next, the light reflected from the optical storage medium 26 returns to the objective lens 25, the mirror 24 and the condensing lens 23 in this order, and is reflected from the beam splitter 27 so as to enter the photodetector 28. The light incident on the photodetector 28 undergoes photoelectric conversion by the photodetector 28 and the photodetector 28 detects a RF signal of a pit row on the optical storage medium 26, a FE signal for carrying out tracing of the pit row and a TE signal and outputs these signals.

Although operations during recording basically are the same as those during the reproduction, the amount of light emitted from the semiconductor laser is larger in the recording than in the reproduction.

Since the optical head device of this embodiment employs the photodetector of Embodiment 1 or Embodiment 2, the optical head device can receive accurate FE signals, TE signals and RF signals from the photodetector 28, so that favorable recording/reproducing can be realized.

In the case where a transmittance of light having a wavelength of $\lambda 1$ with respect to the resin body 2 of the photodetector 28 (See FIGS. 2 to 4) is 10%, it is preferable that the wavelength $\lambda$ of the semiconductor laser (light source) satisfies a relationship of $\lambda 1<\lambda<1.5\cdot\lambda 1$. When the wavelength of the light source satisfies the above relationship, a deterioration of the resin body 2 due to light can be suppressed, thus enabling the provision of a reliable optical head device that can realize favorable recording/reproducing.

Particularly, the wavelength $\lambda$ of the light source preferably is in the range of 390 nm<$\lambda$<420 nm. This is because not only the cutting of a double bond but also the cutting of a single bond can be suppressed effectively, while a high-reliability optical head device capable of recording/reproducing with respect to high-density and large-capacity optical storage media can be provided.

Note here that although the optical head device of this embodiment employs the photodetector so as to detect RF signals, FE signals and TE signals, the photodetector may be used for detecting a monitor signal for controlling an output from the light source. In this case, an optical head device can be provided so as to realize stable control of the output and favorable recording/reproducing.

Embodiment 4

FIG. 6 schematically shows one embodiment of the optical information processing device of the present invention. As shown in FIG. 6, the optical information processing device includes: an optical head device 31; an electric signal processing unit 33 that receives a signal output from the optical head device 31 and calculates the signal to output a predetermined signal; a driving unit (not illustrated) that receives the predetermined signal so as to change a position of at least one selected from the optical head device 31 and a condensing unit 25 (objective lens) (See FIG. 5) of the optical head device 31; a motor 32 and a power supply device 34.

The electric signal processing unit 33 is a circuit board, for example. The power supply device 34 is a power source or a connection terminal for an external power supply, which supplies electricity to the motor 32 and the driving unit. The power source or the connection terminal for an external power supply may be provided for each driving unit such as a tracking control unit and a focus control unit.

Since the optical information processing device of this embodiment employs the optical head device of Embodiment 3, the optical information processing device can receive accurate FE signals, TE signals and RF signals from the photodetector of the optical head, so that favorable recording/reproducing can be realized.

In an optical information processing method embodied using the optical information processing device of this embodiment, when a wavelength of a light source 21 (See FIG. 5) of the optical head is assumed as $\lambda$ and when a transmittance of light having a wavelength of $\lambda 1$ with respect to the resin body 2 of the photodetector (See FIGS. 2 to 4) is 10%, it is preferable that the wavelength $\lambda$ of light from the light source 21 satisfies a relationship of $\lambda 1<\lambda<1.5\cdot\lambda 1$. When the wavelength of light emitted from the light source satisfies the above relationship, a deterioration of the resin body 2 due to light can be suppressed, thus allowing favorable recording/reproducing to be realized.

Particularly, the light source preferably emits light having the wavelength $\lambda$ of 390 nm<$\lambda$<420 nm. This is because not only the cutting of a double bond but also the cutting of a single bond can be suppressed effectively, while recording/reproducing with respect to high-density and large-capacity optical storage media is enabled.

INDUSTRIAL APPLICABILITY

According to the photodetector, the optical head device, the optical information processing device and the optical information processing method of the present invention, the deterioration of optical characteristics of the photodetector can be suppressed, thus enabling favorable recording/reproducing.

The invention claimed is:

1. A photodetector, comprising:
a semiconductor chip that converts received light to an electric signal; and
a resin body that encapsulates the semiconductor chip,
wherein the photodetector further comprises a protective unit, and
at least a light transmission area, through which the light passes, in a surface of the resin body on an incident side of the light is covered by the protective unit,
wherein the protective unit comprises:
a plate member that is disposed above the surface of the resin body on the incident side of the light;
a sealing member that bonds the plate member and the resin body and is located away from the light transmission area; and
an inert gas comprising nitrogen enclosed in a space surrounded by the surface of the resin body on the incident side of the light, the plate member and the sealing member.

2. The photodetector according to claim 1, wherein the resin body comprises an epoxy resin.

3. The photodetector according to claim 1, wherein an absorptance of the light by the resin body is 10% or less.

4. An optical head device, comprising:
a light source;
a condensing unit that receives light emitted from the light source and collects the light onto an optical storage medium; and
a photodetector that receives light reflected from the optical storage medium and converts the light to an electric signal,
wherein the photodetector, comprises:
a semiconductor chip that converts received light to an electric signal; and
a resin body that encapsulates the semiconductor chip,
wherein the photodetector further comprises a protective unit, and
at least a light transmission area, through which the light passes, in a surface of the resin body on an incident side of the light is covered by the protective unit,
wherein the protective unit comprises:
a plate member that is disposed above the surface of the resin body on the incident side of the light;
a sealing member that bonds the plate member and the resin body and is located away from the light transmission area; and
an inert gas comprising nitrogen enclosed in a space surrounded by the surface of the resin body on the incident side of the light, the plate member and the sealing member.

5. The optical head device according to claim 4, wherein, in the case where a transmittance of light having a wavelength of $\lambda 1$ with respect to the resin body is 10%, a wavelength $\lambda$ of the light source satisfies a relationship of $\lambda 1 < \lambda < 1.5 \cdot \lambda 1$.

6. The optical head device according to claim 4, wherein the wavelength $\lambda$ of the light source is in a range of 390 nm $< \lambda < 420$ nm.

7. An optical information processing device, comprising:
an optical head device that comprises: a light source; a condensing unit that receives light emitted from the light source and collects the light onto an optical storage medium; and a photodetector that receives light reflected from the optical storage medium and converts the light to an electric signal, wherein the photodetector, comprises: a semiconductor chip that converts received light to an electric signal; and a resin body that encapsulates the semiconductor chip, wherein the photodetector further comprises a protective unit, and at least a light transmission area, through which the light passes, in a surface of the resin body on an incident side of the light is covered by the protective unit;
an electric signal processing unit that receives a signal output from the optical head device and outputs a predetermined signal; and
a driving unit that receives the predetermined signal so as to change a position of at least one selected from the optical head device and the condensing unit,
wherein the protective unit comprises:
a plate member that is disposed above the surface of the resin body on the incident side of the light;
a sealing member that bonds the plate member and the resin body and is located away from the light transmission area; and
an inert gas comprising nitrogen enclosed in a space surrounded by the surface of the resin body on the incident side of the light, the plate member and the sealing member.

8. An optical information processing method embodied using an optical information processing device that comprises:
an optical head device that comprises: a light source; a condensing unit that receives light emitted from the light source and collects the light onto an optical storage medium; and a photodetector that receives light reflected from the optical storage medium and converts the light to an electric signal, wherein the photodetector, comprises: a semiconductor chip that converts received light to an electric signal; and a resin body that encapsulates the semiconductor chip, wherein the photodetector further comprises a protective unit, and at least a light transmission area, through which the light passes, in a surface of the resin body on an incident side of the light is covered by the protective unit;
an electric signal processing unit that receives a signal output from the optical head device and outputs a predetermined signal; and
a driving unit that receives the predetermined signal so as to change a position of at least one selected from the optical head device and the condensing unit,
wherein in the case where a transmittance of light having a wavelength of $\lambda 1$ with respect to the resin body is 10%, a wavelength $\lambda$ of the light source satisfies a relationship of $\lambda 1 < \lambda < 1.5 \cdot \lambda 1$,
wherein the protective unit comprises:
a plate member that is disposed above the surface of the resin body on the incident side of the light;
a sealing member that bonds the plate member and the resin body and is located away from the light transmission area; and
an inert gas comprising nitrogen enclosed in a space surrounded by the surface of the resin body on the incident side of the light, the plate member and the sealing member.

9. The information processing method according to claim 8, wherein the light source emits light having a wavelength $\lambda$ of 390 nm $< \lambda < 420$ nm.

* * * * *